US011799094B2

(12) United States Patent
Peng et al.

(10) Patent No.: US 11,799,094 B2
(45) Date of Patent: Oct. 24, 2023

(54) GRAPHITE MICRO-CRYSTALLINE CARBON COATING FOR METAL BIPOLAR PLATES OF FUEL CELLS AND APPLICATION THEREOF

(71) Applicant: SHANGHAI JIAO TONG UNIVERSITY, Shanghai (CN)

(72) Inventors: Linfa Peng, Shanghai (CN); Xiaobo Li, Shanghai (CN); Peiyun Yi, Shanghai (CN); Diankai Qiu, Shanghai (CN); Xinmin Lai, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 131 days.

(21) Appl. No.: 16/966,717

(22) PCT Filed: Jan. 23, 2019

(86) PCT No.: PCT/CN2019/072825
§ 371 (c)(1),
(2) Date: Jul. 31, 2020

(87) PCT Pub. No.: WO2020/019693
PCT Pub. Date: Jan. 30, 2020

(65) Prior Publication Data
US 2021/0036336 A1 Feb. 4, 2021

(30) Foreign Application Priority Data
Jul. 23, 2018 (CN) .......................... 201810812159.1

(51) Int. Cl.
*H01M 8/0228* (2016.01)
*C23C 14/02* (2006.01)
*C23C 14/06* (2006.01)
*C23C 14/35* (2006.01)
*H01M 8/0206* (2016.01)

(52) U.S. Cl.
CPC ......... *H01M 8/0228* (2013.01); *C23C 14/025* (2013.01); *C23C 14/0605* (2013.01); *C23C 14/35* (2013.01); *H01M 8/0206* (2013.01)

(58) Field of Classification Search
None
See application file for complete search history.

(56) References Cited

U.S. PATENT DOCUMENTS

| 2010/0035120 A1* | 2/2010 | Sato | H01M 8/0206 |
| | | | 429/480 |
| 2011/0070528 A1* | 3/2011 | Dadheech | H01M 8/0215 |
| | | | 429/523 |

(Continued)

FOREIGN PATENT DOCUMENTS

| CN | 101640276 A | 2/2010 |
| CN | 102054993 A | 5/2011 |

(Continued)

OTHER PUBLICATIONS

International Search Report (in English and in Chinese) and Written Opinion published in PCT/CN2019/072825, dated Apr. 4, 2019, 9 pages provided.

*Primary Examiner* — Alix E Eggerding
(74) *Attorney, Agent, or Firm* — HAMRE, SCHUMANN, MUELLER & LARSON, P.C.

(57) ABSTRACT

The invention relates to a graphite micro-crystalline carbon coating for metal bipolar plates of fuel cells and an application thereof. The graphite micro-crystalline carbon coating is a graphite-like coating deposited on the surface of a metal bipolar plate, includes, by weight, 5%-50% of graphite micro-crystals, and has good compactness. Based on conventional magnetron sputtering technologies, the energy of deposited particles is changed by changing a target sputtering power source, the intensity of a sputtering magnetic field and the deposition temperature of the coating to (Continued)

change the structure of the carbon coating, so that the carbon coating with high conductivity, corrosion resistance, and stability is prepared. Compared with the prior art, under a precondition where the preparation cost of the coating is not increased, the contact resistance of the metal bipolar plate of a fuel cell and a gas diffusion layer can be reduced, and the corrosion resistance of the carbon coating in an acidic environment of the fuel cell and the conductive stability of the carbon coating after a long-time test can be improved, which is of great significance for promoting the commercialization of fuel cells.

3 Claims, 3 Drawing Sheets

(56) References Cited

U.S. PATENT DOCUMENTS

| 2011/0287336 A1* | 11/2011 | Himeno | H01M 8/0228 |
| | | | 429/492 |
| 2014/0227631 A1* | 8/2014 | Jun | H01M 8/0213 |
| | | | 427/580 |

FOREIGN PATENT DOCUMENTS

| CN | 102569828 A | 7/2012 |
| CN | 102723499 A | 10/2012 |
| CN | 104716339 A | 6/2015 |
| CN | 107978770 A | 5/2018 |
| CN | 109037723 A | 12/2018 |

* cited by examiner

GRAPHITE MICRO-CRYSTALLINE CARBON COATING FOR METAL BIPOLAR PLATES OF FUEL CELLS AND APPLICATION THEREOF

BACKGROUND OF THE INVENTION

Technical Field

The invention belongs to the technical field of fuel cells, and relates to a graphite micro-crystalline carbon coating for metal bipolar plates of fuel cells and an application thereof.

Description of Related Art

Fuel cells which use hydrogen as energy have the characteristics of high efficiency and cleanliness and have broad application prospects in many fields. Wherein, the performance of bipolar plates, as one of the essential components of fuel cells, has a restrictive impact on the commercialization of the fuel cells. Metal materials have become the main materials of the bipolar plates of the fuel cells because of their advantages of good mechanical performance, corrosion resistance, and low costs.

The metal bipolar plates of the fuel cells generally work in a high-temperature and high-humidity acidic environment at a pH value of 2-5 and a temperature of 70-100° C., the surfaces of the metal materials in this service environment will be passivated to form a compact metal oxide film with poor conductivity, which leads to an increase of the contact resistance between the metal bipolar plates and gas diffusion layers, and consequentially, voltage losses caused by ohmic polarization of the cells are increased, and the output power of the cells is reduced. Thus, the bipolar plates made from the metal materials cannot meet the performance requirements of the fuel cells for good corrosion resistance and low contact resistance. At present, functional films can be plated on the surfaces of the metal bipolar plates by means of PVD (physical vapor deposition), CVD (chemical vapor deposition), ion plating, chemical plating, electrical plating, or the like to improve the corrosion resistance of the metal bipolar plates and to reduce the contact resistance. Although amorphous carbon films and noble metal films have met the requirements for polar plates of the fuel cells put forward by the US Department of Energy to a certain extent, these noble metal films are high in cost, thus restricting the commercial application of the metal bipolar plates. Because carbon resources are abundant and harmless, carbon is an excellent material in view of resource and environment issues. Currently, the amorphous carbon films are improved both at home and abroad to improve the corrosion resistance of the metal bipolar plates and to reduce the contact resistance.

Carbon coatings have good conductivity and corrosion resistance. However, under the complicated actual vehicle-mounted operation conditions of fuel cell cars, the performance of the carbon coatings will attenuate in the typical case of low-load idling, cyclic loading, or start-stop; and the coatings should have good stability and durability to guarantee the service life of the fuel cells. Chinese Patent CN 101640276A discloses an amorphous carbon coating for bipolar plates of fuel cells, which has good conductivity and corrosion resistance, but data shows that the contact resistance of the coating is greater than 10 mΩ■[ cm]^2 under the working pressure of the bipolar plates, and the conductivity of this coating still remains unknown after a long-time electrochemical test. Chinese Patent CN 107978770A discloses a method for preparing a carbon coating on the surface of a metal partition plate of a fuel cell by means of PECVD. This coating still has the defect of high contact resistance under the working pressure of the partition plates, and the durability of this coating is unknown. In the invention, particle energy during magnetron sputtering is increased to optimize the structure of the carbon coating, so that a carbon coating with high conductivity, corrosion resistance, and stability for metal bipolar plates of fuel cells is obtained.

BRIEF SUMMARY OF THE INVENTION

The objective of the invention is to overcome the defects of the prior art by providing a graphite micro-crystalline carbon coating for metal bipolar plates of fuel cells.

The objective of the invention is fulfilled through the following technical solution: a graphite micro-crystalline carbon coating for metal bipolar plates of fuel cells comprises:

A corrosion-resistant metal priming coating deposited on the surface, having oil stains and an oxide layer removed, of a metal bipolar plate to increase the bonding force of a carbon coating and a metal substrate and to further improve the corrosion resistance of the coating in a service environment of a fuel cell;

A corrosion-resistant metal and carbon co-existing transition coating deposited on the surface of the metal priming coating to decrease the internal stress of the coating and to further increase the bonding force and stability of the coating; and An outermost graphite micro-crystalline carbon coating deposited on the surface of the corrosion-resistant metal and carbon co-existing transition coating to guarantee a low contact resistance between the coating and a gas diffusion layer and good stability and durability of the coating.

Preferably, the metal priming coating is deposited by means of magnetron sputtering and has a thickness of 1-100 nm.

Furthermore, a corrosion-resistant metal in the metal priming coating includes one or more of Ti, Cr, W, Zr, Nb and Ta.

Preferably, the corrosion-resistant metal and carbon co-existing transition coating is deposited by means of co-sputtering of a corrosion-resistant metal target and a graphite target and has a thickness of 1-100 nm.

Furthermore, in the preparation process of the corrosion-resistant metal and carbon co-existing transition coating, the chemical bonding of the corrosion-resistant metal and carbon is promoted by increasing energy of deposited particles to form a metal compound so as to further improve the corrosion resistance of the coating;

Furthermore, the energy of the deposited particles is 1-100 eV; and

Furthermore, the energy of the deposited particles is increased by using a pulse power source for deposition, increasing the temperature in the deposition process, changing the intensity of a sputtering magnetic field, or the like.

Preferably, the outermost graphite micro-crystalline carbon coating is prepared by means of magnetron sputtering, has a thickness of 1-500 nm, and includes a plurality of $sp^2$ hybrid bonds to guarantee good conductivity of the coating as well as a certain amount of $sp^3$ hybrid bonds to guarantee good mechanical performance of the coating.

Furthermore, the outermost graphite micro-crystalline carbon coating includes a certain proportion of graphite micro-crystals. Particularly, the graphite micro-crystals account for 10%-50% of the carbon coating, can guarantee good conductivity and corrosion resistance of the coating, and have an appropriate size of 1-2000 nm. An excessively small grain size may lead to an increase of the defects of a graphite structure, an excessively large grain size may lead to a looseness of a coating structure, and thus, both the excessively large grain size and the excessively small grain size will reduce the corrosion resistance and conductivity of the coating. Besides, the carbon coating needs to have good compactness to prevent an electrolyte from penetrating therein via a hole, which may otherwise cause galvanic corrosion and accelerate the ineffectiveness of the coating.

Preferably, the graphite micro-crystalline carbon coating including a certain proportion of graphite micro-crystals is formed in such a manner that the energy of the deposited particles is changed by changing the temperature in the coating deposition process, a target sputtering power source, and the structure and intensity of a magnetic field, so that the conductivity, corrosion resistance, and stability of the coating are improved.

Furthermore, the temperature in the coating deposition process is changed to 150-600° C. by means of a heater in the coating deposition process;

Furthermore, the target sputtering power source is changed by replacing a DC sputtering power source with a DC pulse power source to control the energy of the deposited particles, and the DC pulse sputtering power source has a frequency of 50-350 kHz and a duty ratio of 10%-45%; and Furthermore, the structure and intensity of the sputtering magnetic field is changed by changing the magnetic field distribution and the magnetic pole layout, and, the magnetic field intensity is 300-1500 Gs.

Preferably, the total thickness of the coating is 50-1000 nm.

A method for preparing the graphite micro-crystalline carbon coating for metal bipolar plates of fuel cells comprises the following steps:

(1) Cleaning the metal bipolar plate to remove oil stains and an oxide layer on the surface of the metal bipolar plate;

(2) Plating the corrosion-resistant metal priming coating on the surface of the metal bipolar plate;

(3) Depositing the corrosion-resistant metal and carbon co-existing transition coating on the surface of the corrosion-resistant metal priming coating; and (4) Depositing the pure carbon coating with high conductivity, corrosion resistance, and stability on the surface of the co-existing transition coating.

In the invention, the particle energy is changed by changing the sputtering power source, the sputtering magnetic field and the deposition temperature to control the graphite micro-crystalline proportion, the graphite grain size, crystal defects, and the compactness of the carbon coating, so that the conductivity and corrosion resistance of the carbon coating are optimized, and the stability and durability of the carbon coating are improved.

Compared with the prior art, the invention has the following advantages:

(1) On the basis of a coating prepared by means of magnetron sputtering, the particle energy is changed to optimize the carbon structure, so that obtained carbon coating has better conductivity and corrosion resistance, and is slow in performance degradation in the service environment of the fuel cell, and has better stability and durability.

(2) The particle energy can be conveniently changed in a magnetron sputtering device at a low cost, so that the carbon coating with high conductivity, corrosion resistance, and stability is low in cost.

In summary,, the invention is of great significance for improving the durability of the metal bipolar plate of the fuel cell and promoting the industrialization of the fuel cell.

Reference Signs:

1, metal bipolar plate; 2, corrosion-resistant metal priming coating; 3, corrosion-resistant metal and carbon co-existing transition coating; 4, metal carbide crystal; 5, carbon coating; 6, graphite micro-crystalline; 7, defective graphite micro-crystalline.

DETAILED DESCRIPTION OF THE INVENTION

The invention is expounded below in combination with the accompanying drawings and specific embodiments. These embodiments are implemented on the premise of the technical solution of the invention, and detailed implementations and specific operation processes are given. However, the protection scope of the invention is not limited to the following embodiments.

Embodiment 1

Figure 1:
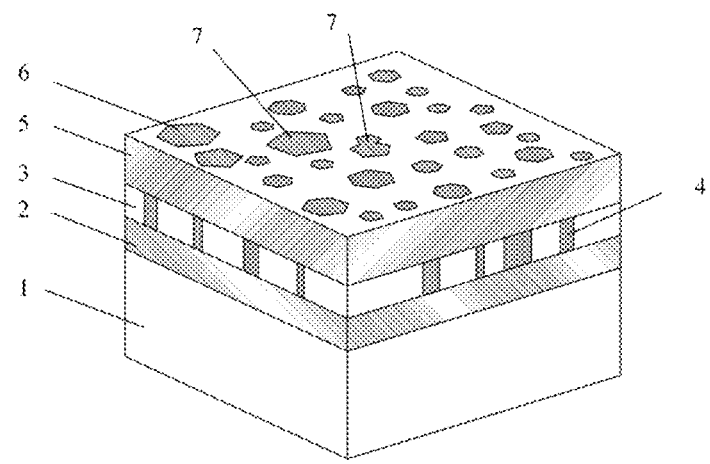
FIG. 1 is an overall structural view of a coating prepared in Embodiments 2, 3, and 4.
Figure 6:
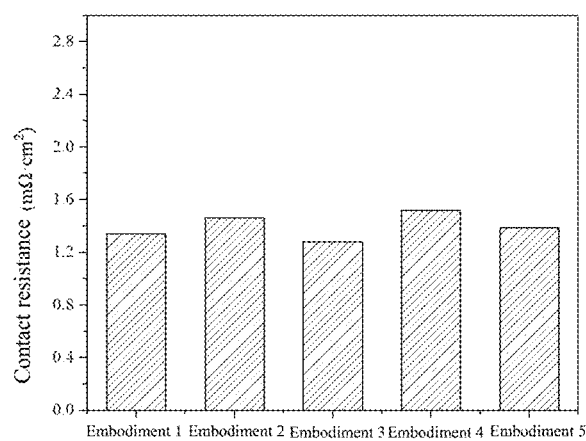
FIG. 6 is a diagram of a test result of a contact resistance of a coating prepared in all embodiments.

As shown in FIG. 1, a method for preparing a high-conductivity, corrosion-resistant and stable carbon coating for a metal bipolar plate comprises the following steps:

(1) The surface of a metal bipolar plate 1 is cleaned with a cleaning agent to remove oil strains and impurities; the cleaned metal bipolar plate 1 is dried and placed into a furnace chamber, and then the vacuum degree of the furnace chamber is controlled; and after the vacuum degree reaches a set value, an ion source is started to generate plasma to bombard the surface of the metal bipolar plate 1 to remove a metal oxide layer on the surface of the bipolar plate 1 to improve surface cleanliness, so that the film-substrate bonding force is increased;

(2) A 100 nm corrosion-resistant metal (Cr) priming coating 2 is deposited in advance on the surface of the metal bipolar plate 1 treated in Step (1) to improve the corrosion resistance of the coating and further increase the film-substrate bonding force;

(3) A corrosion-resistant metal and carbon co-existing transition coating 3 is deposited on the surface of the corrosion-resistant metal priming coating 2 deposited in Step (2); and at this moment, Ar is injected at an appropriate flow rate, and a corrosion-resistant Cr target and a graphite target are started to carry out co-sputtering to form a corrosion-resistant Cr and carbon co-existing transition coating 3 to further increase the film-substrate bonding force, so that coating shedding caused by an excessive internal stress is prevented, wherein the deposition thickness of the transition coating is 50 nm;

(4) After the transition coating is completely deposited in Step (3), the furnace chamber is heated by a heating device to increase the temperature to 500° C., and the temperature is maintained for a period of time to guarantee the temperature uniformity in the furnace chamber; and then sputtering of the graphite target is started to deposit a carbon film to obtain a carbon coating 5 which also includes graphite micro-crystals 6 and defective graphite micro-crystals 7, wherein a DC power source is used for sputtering of the graphite target, and the deposition thickness of the carbon coating is 200 nm; and (5) A test result of the contact resistance of the coating is shown in FIG. 6.

Embodiment 2

Figure 2:
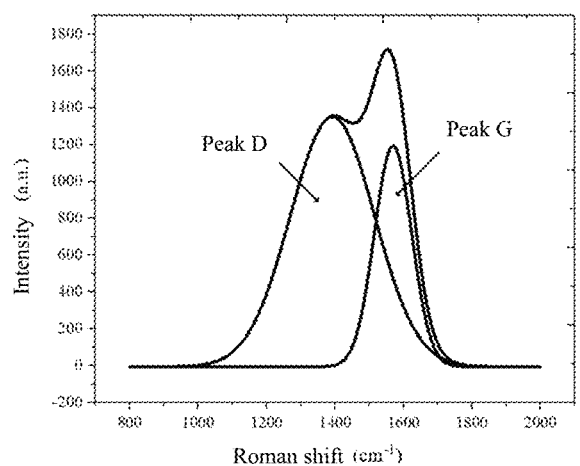
FIG. 2 is a Raman analysis graph of the coating prepared in Embodiment 2.
Figure 3:
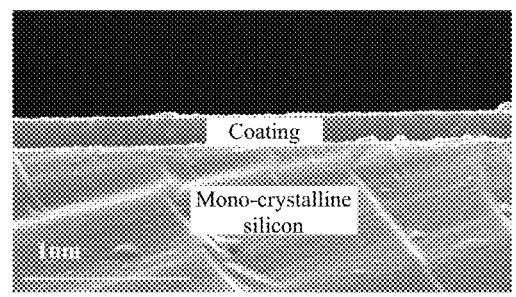
FIG. 3 is a sectional morphology SEM picture of the coating prepared in Embodiment 2.

(1) The surface of a metal bipolar plate 1 is cleaned with a cleaning agent to remove oil stains and impurities; the cleaned metal bipolar plate 1 is dried and placed into a furnace chamber, and then the vacuum degree of the furnace chamber is controlled; and after the vacuum degree reaches a set value, the furnace chamber is heated by a heating device to increase the temperature to 400° C., and then the temperature is maintained for a period of time; after the temperature in the furnace chamber is uniform, an ion source is started to generate plasma to bombard the surface of the metal bipolar plate to remove a metal oxide layer on the surface of the metal bipolar plate 1 to improve surface cleanliness, so that the film-substrate bonding force is increased;

(2) A 50 nm corrosion-resistant Ti priming coating is deposited in advance on the surface of the metal bipolar plate 1 treated in Step (1) to improve the corrosion resistance of the coating and to further increase film-substrate bonding force;

(3) A corrosion-resistant metal and carbon co-existing transition coating 3 is deposited on the surface of the corrosion-resistant metal priming coating 2 deposited in Step (2); at this moment, Ar is injected at an appropriate flow rate, and a corrosion-resistant Ti target and a graphite target are started to carry out co-sputtering to form a corrosion-resistant Ti and carbon co-existing transition coating to further increase the film-substrate bonding force, so that coating shedding caused by an excessive internal stress is prevented; and a high temperature in this deposition process facilitates the chemical combination of Ti and C to form a metal carbide 4 with better corrosion resistance, so that the corrosion resistance of the coating is further improved, wherein the deposition thickness of the transition coating is 50 nm;

(4) After the transition coating is completely deposited in Step (3), sputtering of the graphite target is started to deposit a carbon film to obtain a carbon coating 5, wherein a DC power source is used for sputtering of the graphite target, and the deposition thickness of the carbon coating is 100 nm; and (5) Properties of the deposited coating are represented, wherein FIGS. 1, 2, and 3 respectively show a structural view, a Raman structural graph, a sectional SEM analysis graph of the coating. Compared with conventional amorphous carbon coatings prepared by means of magnetron sputtering, the carbon coating prepared in this embodiment includes a certain proportion of graphite micro-crystals 6 with few defects and large grains, and has good compactness, thus having excellent conductivity, corrosion resistance, and durability. A test result of the contact resistance of the coating is shown in FIG. 6.

Embodiment 3

Figure 4:
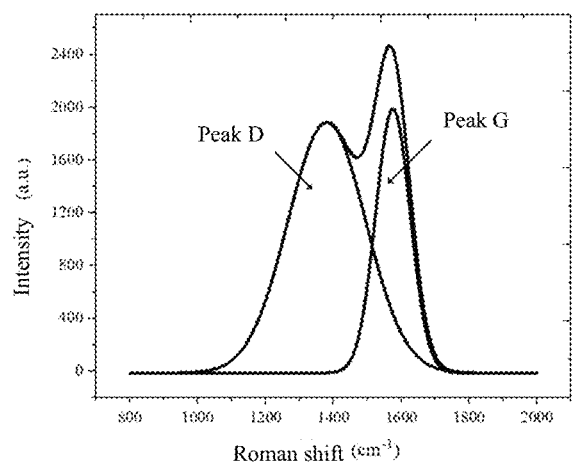
FIG. 4 is a Raman analysis graph of the coating prepared in Embodiment 3.
Figure 5:
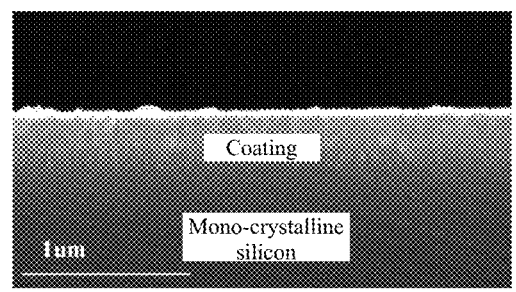
FIG. 5 is a sectional morphology SEM picture of the coating prepared in Embodiment 3.

A method for preparing the high-conductivity, corrosion-resistant and stable carbon coating for a metal bipolar plate comprises the following steps:

(1) The surface of a metal bipolar plate 1 is cleaned with a cleaning agent to remove oil strains and impurities; the cleaned metal bipolar plate 1 is dried and placed into a furnace chamber, and then the vacuum degree of the furnace chamber is controlled; and after the vacuum degree reaches a set value, an ion source is started to generate plasma to bombard the surface of the metal bipolar plate 1 to remove a metal oxide layer on the surface of the bipolar plate 1 to improve surface cleanliness, so that a film-substrate bonding force is increased;

(2) A 50 nm corrosion-resistant metal Ti priming coating is deposited in advance on the surface of the metal bipolar plate 1 treated in Step (1) to improve the corrosion resistance of the coating and to further increase the film-substrate bonding force;

(3) A corrosion-resistant metal and carbon co-existing transition coating 3 is deposited on the surface of the corrosion-resistant metal priming coating 2 deposited in Step (2); at this moment, Ar is injected at an appropriate flow rate, and a corrosion-resistant Ti target and a graphite target are started to carry out co-puttering to form a corrosion-resistant Ti and carbon co-existing transition coating to further increase the film-substrate bonding force, so that coating shedding caused by an excessive internal stress is prevented; and a pulse power source which has a frequency of 350 kHz and a duty ratio of 40% is used for sputtering of the Ti target and the graphite target, and particle energy is increased through the pulse power source to facilitate the chemical combination of Ti and C to form a metal carbide 4, so that the corrosion resistance of the coating is further improved, wherein the deposition thickness of the transition coating is 50 nm;

(4) Sputtering of the graphite target is started to deposit a carbon film to obtain a carbon coating 5, wherein a pulse sputtering power source which has a frequency of 350 kHz and a duty ratio of 40% is used for sputtering of the graphite target, and the deposition thickness of the carbon coating is 200 nm; and (5) The properties of the deposited coating are represented, wherein FIGS. 1, 4, and 5 respectively show a structural view, a Raman structural graph, a sectional SEM analysis graph of the coating. Compared with conventional amorphous carbon coatings prepared by means of magnetron sputtering, the carbon coating prepared in this embodiment includes a certain proportion of graphite micro-crystals 6 with few defects and large grains, and has good compactness, thus having excellent conductivity, corrosion resistance, and durability. A test result of the contact resistance of the coating is shown in FIG. 6.

Embodiment 4

Figure 7:
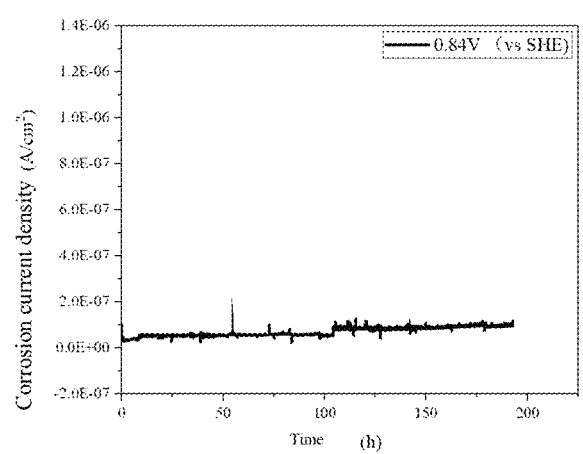
FIG. 7 is a current density curve of the coating prepared in Embodiment 4 and polarized for 200 h at a constant potential of 0.84V (vs SHE) in an $H_2SO_4$ (including 0.1 ppm HF) solution at pH of 3 and 80° C.

(1) The surface of a metal bipolar plate 1 is cleaned with a cleaning agent to remove oil strains and impurities; the cleaned metal bipolar plate 1 is dried and placed into a furnace chamber, and then the vacuum degree of the furnace chamber is controlled; and after the vacuum degree reaches a set value, the furnace chamber is heated by a heating device to increase the temperature to 200° C., and then the temperature is maintained for a period of time; after the temperature in the furnace chamber is uniform, an ion source is started to generate plasma to bombard the surface of the metal bipolar plate to remove a metal oxide layer on the surface of the metal bipolar plate 1 to improve surface cleanliness, so that a film-substrate bonding force is increased;

(2) A 50 nm corrosion-resistant Ti priming coating is deposited in advance on the surface of the metal bipolar plate treated in Step (1) to improve the corrosion resistance of the coating and to further increase the film-substrate bonding force;

(3) A corrosion-resistant metal and carbon co-existing transition coating 3 is deposited on the surface of the corrosion-resistant metal priming coating 2 deposited in Step (2); at this moment, Ar is injected at an appropriate flow rate, and a corrosion-resistant Ti target and a graphite target are started to carry out co-sputtering to form a corrosion-resistant Ti and carbon co-existing transition coating to further increase the film-substrate bonding force, so that coating shedding caused by an excessive internal stress is prevented; and a pulse power source which has a frequency of 350 kHz and a duty ratio of 40% is used for sputtering of the Ti target and the graphite target sputtering power source, a temperature in the deposition and the pulse power source increase particle energy to facilitate the chemical combination of Ti and C to form a metal carbide 4, so that the corrosion resistance of the coating is further improved, wherein the deposition thickness of the transition coating is 50 nm;

(4) After the transition coating is completely deposited in Step (3), the furnace chamber is heated by a heating device to increase the temperature to 200° C., and the temperature is maintained for a period of time to guarantee the temperature uniformity in the furnace chamber; and then sputtering of the graphite target is started to deposit a carbon film to obtain a carbon coating 5, wherein a pulse sputtering power source which has a frequency of 150 kHz and a duty ratio of 40% is used for sputtering of the graphite target, and the deposition thickness of the carbon coating is 200 nm; and (5) The properties of the deposited coating are represented, wherein FIG. 1 shows a structural view of the coating. A service environment of a fuel cell is simulated to perform an electrochemical test on the coating, and FIG. 6 shows a test result of the contact resistance of the coating before the coating is corroded and after the coating is corroded for 200 h at 0.84V (vs SHE). This test result indicates that the carbon coating prepared through this method has excellent corrosion resistance, and durability. The test result of the contact resistance of the coating is shown in FIG. 6. The corrosion current density for corrosion at a constant potential of 0.84V (vs SHE) in a simulated acidic environment of the fuel cell is shown in FIG. 7.

Embodiment 5

A method for preparing the high-conductivity, corrosion-resistant and stable carbon coating for a metal bipolar plate comprises the following steps:

(1) The surface of a metal bipolar plate 1 is cleaned with a cleaning agent to remove oil stains and impurities; the cleaned metal bipolar plate 1 is dried and placed into a furnace chamber, and then the vacuum degree of the furnace chamber is controlled; and after the vacuum degree reaches a set value, an ion source is started to generate plasma to bombard the surface of the metal bipolar plate 1 to remove a metal oxide layer on the surface of the bipolar plate 1 to improve surface cleanliness, so that a film-substrate bonding force is increased;

(2) A 50 nm corrosion-resistant Ti priming coating is deposited in advance on the surface of the metal bipolar plate treated in Step (1) to improve the corrosion resistance of the coating and to further increase the film-substrate bonding force;

(3) A corrosion-resistant metal and carbon co-existing transition coating 3 is deposited on the surface of the corrosion-resistant metal priming coating 2 deposited in Step (2); and at this moment, Ar is injected at an appropriate rate, and a corrosion-resistant Ti target and a graphite target are started to carry out co-sputtering to form a corrosion-resistant Ti and carbon co-existing transition coating 3 to further increase the film-substrate bonding force, so that coating shedding caused by an excessive internal stress is prevented, wherein the deposition thickness of the transition coating is 50 nm;

(4) Sputtering of the graphite target is started to deposit a carbon film to obtain a carbon coating 5, wherein a DC power source is used for sputtering of the graphite target, a sputtering magnetic field corresponding to the DC power source is an intense magnetic field with an intensity of 800 Gs, and the thickness of the carbon coating is 200 nm.

The description of the above embodiments is used for assisting those ordinarily skilled in the art in understanding and using the invention. Clearly, those skilled in the art can easily make various modifications on these embodiments and can apply the general principle of this specification to other embodiments without creative work. Thus, the invention is not limited to these embodiments, and all improvements and modifications made by those skilled in the art according to the invention without deviating from the scope of the invention should also fall within the protection scope of the invention.

What is claimed is:

1. A graphite carbon coating for metal bipolar plates of fuel cells, being deposited on a surface of a metal bipolar plate, the graphite carbon coating comprising:
   amorphous carbon; and
   by weight, 5%-50% of graphite micro-crystals, wherein a grain size of the graphite micro-crystals is 1-2000 nm, wherein
   the graphite carbon coating having a contact resistance of less than 1.6 mΩ.cm$^2$, and the graphite carbon coating is prepared by changing energy of deposited particles during deposition of the graphite micro-crystals and has high conductivity, corrosion resistance, and stability, and
   the energy of the deposited particles is 1-100 eV, the energy of the deposited particles is changed by changing a deposition temperature in a coating deposition process, and the deposition temperature is changed to 150-600° C. by means of a heater in the coating deposition process.

2. The graphite carbon coating for metal bipolar plates of fuel cells according to claim 1, wherein the graphite carbon coating
   has a thickness of 1-500 nm, and
   the graphite micro-crystals account for 10%-30% of a total weight of the carbon coating.

3. The graphite carbon coating of claim 1, wherein the graphite carbon coating having an intensity ratio of D peak at 1360 cm$^{-1}$ over G peak 1580 cm$^{-1}$ of 3.3.

\* \* \* \* \*